United States Patent
Sung et al.

(10) Patent No.: US 10,908,199 B2
(45) Date of Patent: Feb. 2, 2021

(54) DEVICE AND METHOD FOR MEASURING INSULATION RESISTANCE OF BATTERY PACK BY USING NEGATIVE ELECTRODE RELAY

(71) Applicant: LG CHEM, LTD., Seoul (KR)

(72) Inventors: Chang Hyun Sung, Daejeon (KR); Yasuhito Eguchi, Ebina (JP)

(73) Assignee: LG CHEM, LTD., Seoul (KR)

( * ) Notice: Subject to any disclaimer, the term of this patent is extended or adjusted under 35 U.S.C. 154(b) by 148 days.

(21) Appl. No.: 16/317,391

(22) PCT Filed: Jan. 23, 2018

(86) PCT No.: PCT/KR2018/000994
§ 371 (c)(1),
(2) Date: Jan. 11, 2019

(87) PCT Pub. No.: WO2018/139830
PCT Pub. Date: Aug. 2, 2018

(65) Prior Publication Data
US 2019/0242933 A1 Aug. 8, 2019

(30) Foreign Application Priority Data

Jan. 24, 2017 (KR) .................. 10-2017-0011122

(51) Int. Cl.
*G01R 27/02* (2006.01)
*G01R 31/36* (2020.01)
(Continued)

(52) U.S. Cl.
CPC .......... *G01R 27/025* (2013.01); *G01R 27/02* (2013.01); *G01R 31/36* (2013.01); *G01R 31/50* (2020.01);
(Continued)

(58) Field of Classification Search
CPC ...... G01R 27/025; G01R 31/50; G01R 27/02; G01R 31/36; G01R 31/52; G01R 31/389;
(Continued)

(56) References Cited

U.S. PATENT DOCUMENTS 9,024,769 B2 5/2015 Hong et al.
9,244,108 B2 * 1/2016 Hausberger ............. B60L 58/10
(Continued)

FOREIGN PATENT DOCUMENTS

JP 2011-252827 A 12/2011
KR 10-2010-0019976 A 2/2010
(Continued)

OTHER PUBLICATIONS

International Search Report (PCT/ISA/210) issued in PCT/KR2018/000994, dated May 8, 2018.

*Primary Examiner* — Lee E Rodak
(74) *Attorney, Agent, or Firm* — Birch, Stewart, Kolasch & Birch, LLP

(57) ABSTRACT

An apparatus and a method for measuring insulation resistance of a battery pack using an insulation resistance meter (IRM) circuit where only a negative relay is electrically conducted, thereby decreasing a risk of electric shock when insulation resistance is measured in a state where an external insulation resistor of the battery pack is broken.

5 Claims, 4 Drawing Sheets

(51) Int. Cl.
  *H01M 10/48* (2006.01)
  *H01M 10/42* (2006.01)
  *G01R 31/50* (2020.01)

(52) U.S. Cl.
  CPC ....... *H01M 10/425* (2013.01); *H01M 10/482* (2013.01)

(58) Field of Classification Search
  CPC .. G01R 31/364; G01R 31/378; G01R 31/006; G01R 27/18; G01R 31/025; G01R 31/007; G01R 31/3278; G01R 31/3835; G01R 27/205; G01R 31/14; G01R 31/3277; G01R 35/00; G01R 31/1272; G01R 31/3606; G01R 31/382; G01R 31/396; G01R 19/0084; G01R 27/14; G01R 31/1245; H01M 10/425; H01M 10/482; H01M 10/48; B60L 3/0046; B60L 3/0069; B60L 2240/547; B60L 2240/549; B60L 3/12; B60L 58/10; B60L 2240/545; H01H 47/002; Y02T 10/7005
  See application file for complete search history.

(56) References Cited

U.S. PATENT DOCUMENTS

| | | | |
|---|---|---|---|
| 9,720,049 B2* | 8/2017 | Anzicek | G01R 31/396 |
| 2010/0156426 A1 | 6/2010 | Kang et al. | |
| 2010/0244850 A1* | 9/2010 | Yano | B60L 58/40 |
| | | | 324/510 |
| 2013/0314097 A1* | 11/2013 | Hausberger | G01R 27/025 |
| | | | 324/503 |
| 2015/0115972 A1* | 4/2015 | Park | G01R 31/006 |
| | | | 324/503 |
| 2016/0154064 A1* | 6/2016 | Klein | G01R 31/3277 |
| | | | 324/433 |
| 2017/0160327 A1* | 6/2017 | Jung | G01R 31/12 |
| 2017/0227589 A1* | 8/2017 | Kawanaka | G01R 31/3277 |

FOREIGN PATENT DOCUMENTS

| | | |
|---|---|---|
| KR | 10-2013-0059107 A | 6/2013 |
| KR | 10-2013-0128597 A | 11/2013 |
| KR | 10-1470552 B1 | 12/2014 |
| KR | 10-1675191 B1 | 11/2016 |

* cited by examiner

[Figure 1]

[Figure 3]
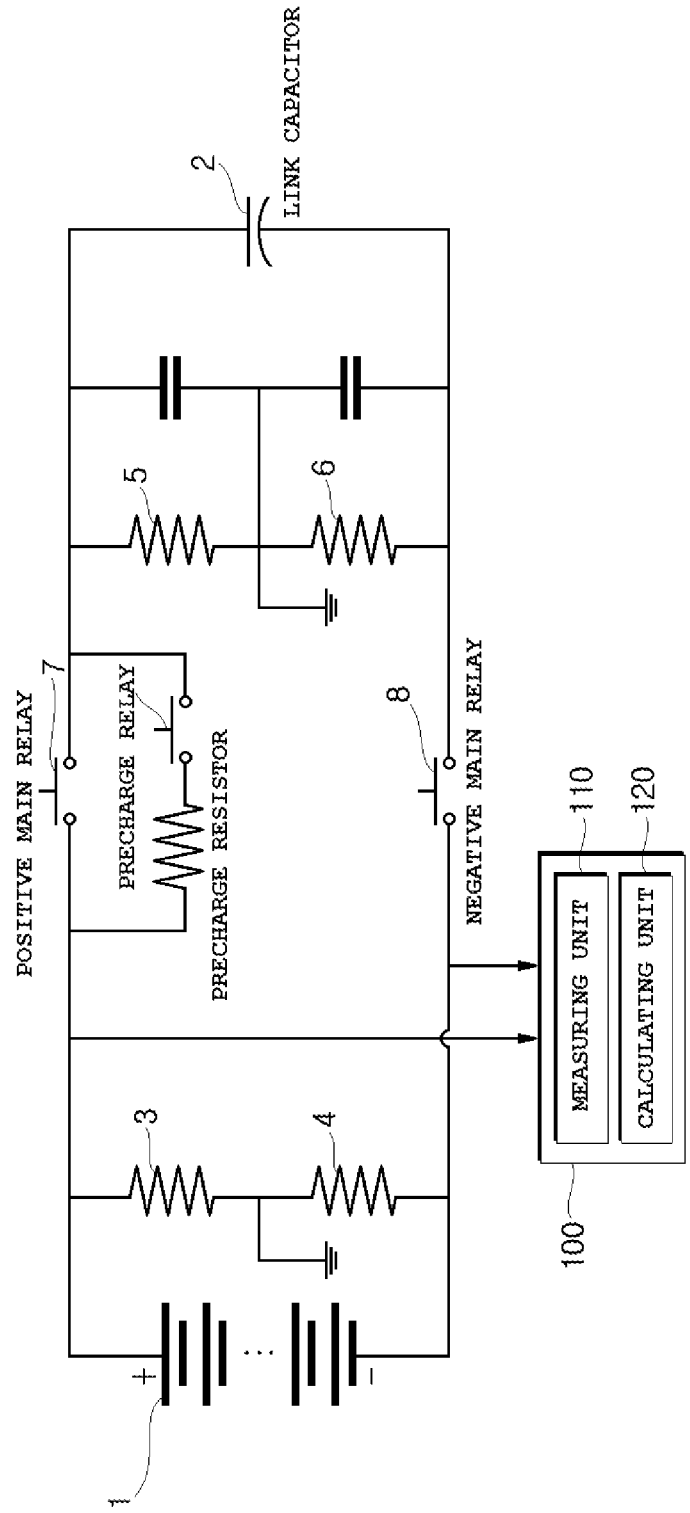

[Figure 4]
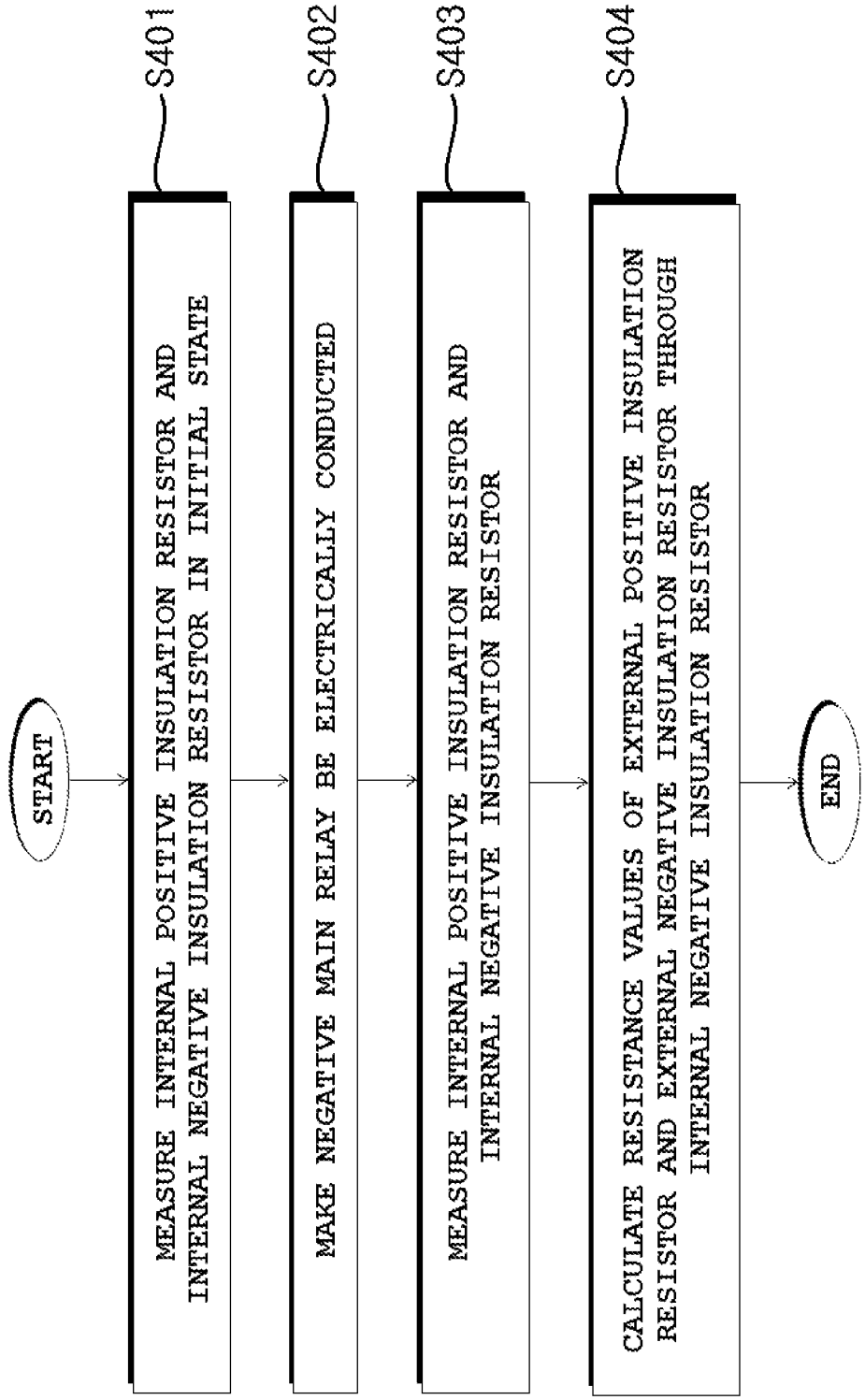

DEVICE AND METHOD FOR MEASURING INSULATION RESISTANCE OF BATTERY PACK BY USING NEGATIVE ELECTRODE RELAY

TECHNICAL FIELD

This application claims priority to and the benefit of Korean Patent Application No. 10-2017-0011122 filed in the Korean Intellectual Property Office on Jan. 24, 2017, the entire contents of which are incorporated herein by reference.

The present invention relates to an apparatus and a method of measuring insulation resistance of a battery pack by using a negative relay, and more particularly, to an apparatus and a method of measuring insulation resistance of a battery pack by using a negative relay, in which when insulation resistance of a battery pack is measured by using an insulation resistance meter (IRM) circuit, insulation resistance of the battery pack is measured in a state where only a negative relay is electrically conducted, not in a state where both a positive relay and a negative relay are electrically conducted, thereby decreasing a risk of electric shock when insulation resistance is measured in a state where an external insulation resistor of the battery pack is broken.

BACKGROUND ART

In general, in a battery management system (BMS) connected with a battery cell, when insulation resistance, particularly, insulation resistance positioned between a positive electrode and a negative electrode, of a battery pack is broken, there is risk in that leakage current is generated to cause electric shock during a measurement of insulation resistance, and thus there is concern that a usage time of a battery is decreased.

Accordingly, the BMS practically needs to periodically monitor insulation resistance of a battery pack through an insulation resistance meter circuit (IRM circuit).

In the meantime, the IRM circuit measures a voltage by connecting predetermined test resistance to a battery pack and then calculates insulation resistance based on the measured voltage, and in this case, in order to measure a resistance value of insulation resistance outside the battery pack, it is necessary to make both a positive relay and a negative relay be electrically conducted (close). However, when both the positive relay and the negative relay are electrically conducted in the state where the external insulation resistor is broken, there is concern that a risk of electric shock is generated due to a leakage current.

Accordingly, currently, there is actually a need for a method having stability which is capable of measuring external insulation resistance of a battery pack before both a positive relay and a negative relay are electrically conducted.

Accordingly, in order to solve various problems and limits generated during a process of measuring external insulation resistance of the battery pack in the related art, the present inventors developed an apparatus and a method of measuring insulation resistance of a battery pack by using a negative relay, in which when insulation resistance of a battery pack is measured by using an IRM circuit, insulation resistance of the battery pack is measured in a state where only a negative relay is electrically conducted, not in a state where both a positive relay and a negative relay are electrically conducted, thereby decreasing a risk of electric shock when insulation resistance is measured in a state where an external insulation resistor of the battery pack is broken.

DETAILED DESCRIPTION OF THE INVENTION

Technical Problem

The present invention is conceived to solve the problems, and provides an apparatus and a method of measuring insulation resistance of a battery pack by using a negative relay, in which when insulation resistance of a battery pack is measured by using an insulation resistance meter (IRM) circuit, insulation resistance of the battery pack is measured in a state where only a negative relay is electrically conducted, not in a state where both a positive relay and the negative relay are electrically conducted, thereby decreasing a risk of electric shock when insulation resistance is measured in a state where an external insulation resistor of the battery pack is broken.

Technical Solution

An exemplary embodiment of the present invention provides an apparatus for measuring insulation resistance of a battery pack by using a negative relay, the apparatus including: a measuring unit which measures resistance values of an internal positive insulation resistor and an internal negative insulation resistor connected to both ends of a battery pack; and a calculating unit which when a negative main relay, of which one side is connected with an external positive insulation resistor between the external positive insulation resistor and the external negative insulation resistor connected with a link capacitor and the other side is connected with the measuring unit, is electrically conducted (close), calculates resistance values of the external positive insulation resistor and the external negative insulation resistor, which are connected with the internal negative insulation resistor in parallel, based on the resistance values of the internal positive insulation resistor and the internal negative insulation resistor measured by the measuring unit.

In the exemplary embodiment, the measuring unit may measure the resistance values of the internal positive insulation resistor and the internal negative insulation resistor in advance in an open state that is before the negative main relay is electrically conducted and measure a parallel resistance value of the external positive insulation resistor and the external negative insulation resistor measured in the state where the negative main relay is electrically conducted.

In the exemplary embodiment, when the resistance values of the internal positive insulation resistor and the internal negative insulation resistor are measured by the measuring unit in the state where the negative main relay is electrically conducted, a parallel resistance value of the external positive insulation resistor and the external negative insulation resistor may be measured together.

In the exemplary embodiment, the calculating unit may calculate the resistance value of each of the external positive insulation resistor and the external negative insulation resistor based on the resistance value of the internal negative insulation resistor measured in advance when the negative main relay is in the open state that is before the negative main relay is electrically conducted, and the parallel resistance value of the external positive insulation resistor and the external negative insulation resistor measured in the state where the negative main relay is electrically conducted.

Another exemplary embodiment of the present invention provides a method of measuring insulation resistance of a battery pack by using a negative relay, the method including: measuring, by a measuring unit which is connected to an internal positive insulation resistor and an internal negative insulation resistor connected to both ends of a battery pack, resistance values of the internal positive insulation resistor and the internal negative insulation resistor; making a negative main relay, of which one side is connected with an external negative insulation resistor between an external positive insulation resistor and the external negative insulation resistor connected with a link capacitor and the other side is connected with the measuring unit, be electrically conducted (close); and calculating, by a calculating unit, resistance values of the external positive insulation resistor and the external negative insulation resistor, which are connected with the internal negative insulation resistor in parallel, based on measurement values obtained by measuring, by the measuring unit, the resistance values of the internal positive insulation resistor and the internal negative insulation resistor.

In the exemplary embodiment, the measuring of the resistance value of the internal negative insulation resistor may include measuring the resistance values of the internal positive insulation resistor and the internal negative insulation resistor in advance in the open state that is before the negative main relay is electrically conducted, and the making of the negative main relay be electrically conducted may include measuring a parallel resistance value of the external positive insulation resistor and the external negative insulation resistor in the state where the negative main relay is electrically conducted.

In the exemplary embodiment, the measuring of the resistance values of the external positive insulation resistor and the external negative insulation resistor in the state where the negative main relay is electrically conducted may include measuring the parallel resistance value of the external positive insulation resistor and the external negative insulation resistor together when the resistance values of the internal positive insulation resistor and the internal negative insulation resistor are measured by the measuring unit in the state where the negative main relay is electrically conducted.

In the exemplary embodiment, the calculating unit may calculate the resistance value of each of the external positive insulation resistor and the external negative insulation resistor based on the resistance value of the internal negative insulation resistor measured in advance when the negative main relay is in the open state that is before the negative main relay is electrically conducted, and the parallel resistance value of the external positive insulation resistor and the external negative insulation resistor measured in the state where the negative main relay is electrically conducted.

Advantageous Effect

According to one aspect of the present invention, when insulation resistance of a battery pack is measured by using an insulation resistance meter (IRM) circuit, insulation resistance of the battery pack is measured in a state where only a negative relay is electrically conducted, not in a state where both a positive relay and the negative relay are electrically conducted, so that it is possible to decrease a risk of electric shock when insulation resistance is measured in a state where an external insulation resistor of the battery pack is broken, thereby improving stability.

BRIEF DESCRIPTION OF DRAWINGS

FIG. 3 is a diagram schematically illustrating a process of measuring insulation resistance (internal insulation resistance and external insulation resistance) of a battery pack through an apparatus 100 for measuring insulation resistance of a battery pack by using a negative relay according to an exemplary embodiment of the present invention.

FIG. 4 is a flowchart sequentially illustrating a process of measuring insulation resistance of a battery pack through the apparatus 100 for measuring insulation resistance of a battery pack by using a negative relay according to the exemplary embodiment of the present invention.

MODE FOR CARRYING OUT THE INVENTION

Hereinafter, an exemplary embodiment is presented for helping understanding of the present invention. However, the exemplary embodiment below is simply provided for easier understanding of the present invention, and the contents of the present invention are not limited by the exemplary embodiment.

Figure 1:
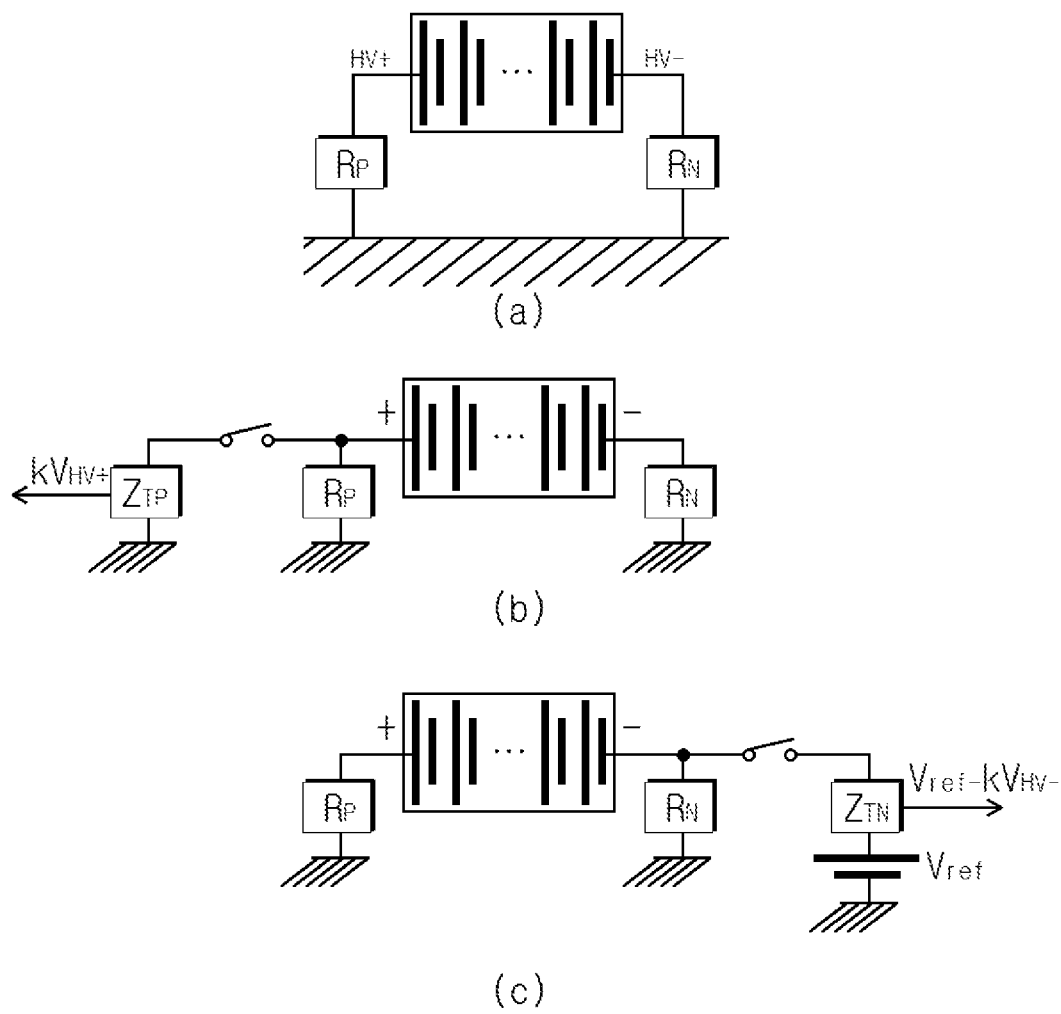
FIG. 1 is a diagram schematically illustrating a general process of measuring insulation resistance of a battery pack.
Figure 2:
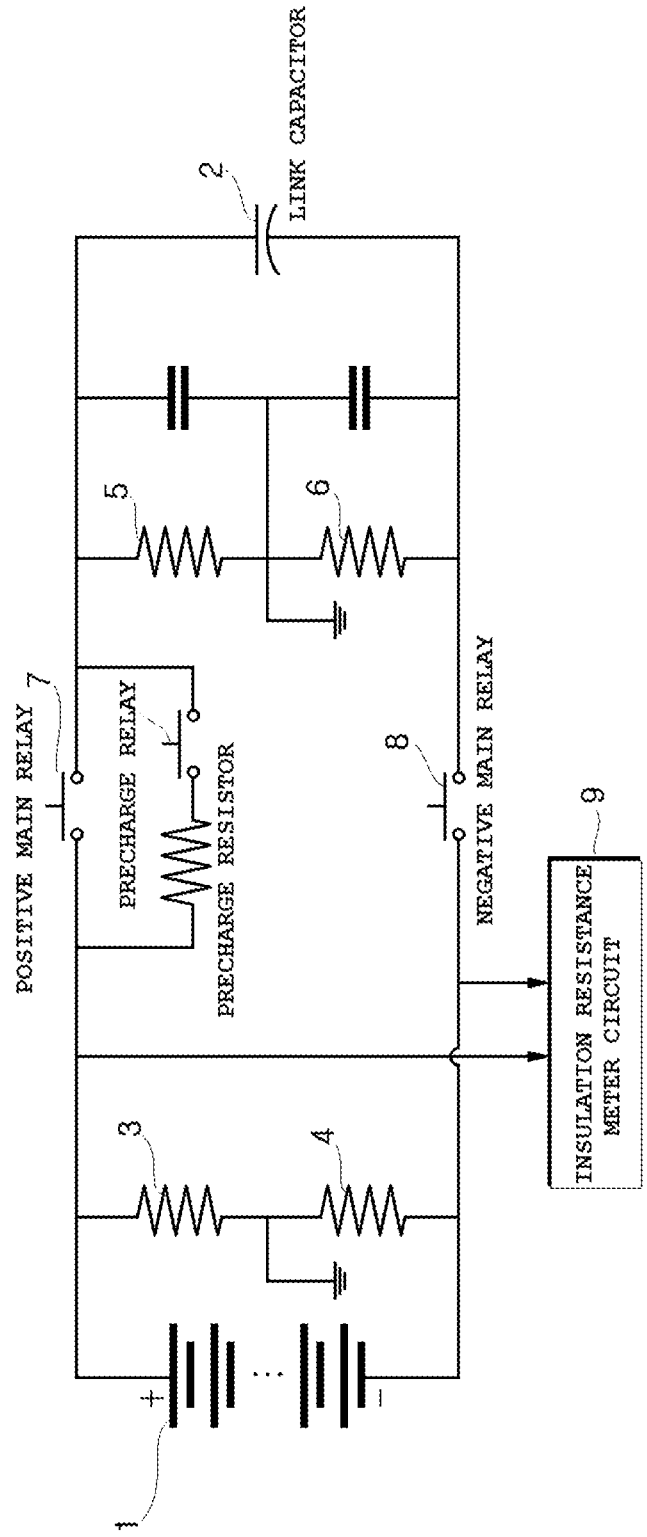
FIG. 2 is a diagram schematically illustrating a process of measuring insulation resistance (internal insulation resistance and external insulation resistance) of a battery pack in the related art.

FIG. 1 is a diagram schematically illustrating a general process of measuring insulation resistance of a battery pack, and FIG. 2 is a diagram schematically illustrating a process of measuring insulation resistance (internal insulation resistance and external insulation resistance) of a battery pack in the related art.

First, referring to FIG. 1A, insulation resistance $R_P$ and $R_N$ are connected to a positive electrode HV+ and a negative electrode HV− of a battery pack in which one or more battery modules are combined, respectively.

In this case, in order to measure a resistance value of each insulation resistance, a method of connecting test resistance $Z_{TP}$ and $Z_{TN}$ through switches is used as illustrated in FIG. 1B, and in this case, the method includes two operations.

Referring to FIG. 1B, FIG. 1B illustrates an operation of measuring a positive side voltage, and a switch is connected between the insulation resistance $R_P$ and the test resistance $Z_{TP}$ connected to the positive electrode of the battery pack, and a voltage applied after the connection of the test resistance $Z_{TP}$ is scaled down and measured.

Referring to FIG. 1C, FIG. 1C illustrates an operation of measuring a negative side voltage, and a switch is connected between the insulation resistance $R_n$ and the test resistance $Z_{TN}$ connected to the negative electrode of the battery pack, and a voltage applied after the connection of the test resistance $Z_{TN}$ is scaled down and measured. In this case, a voltage reference (V reference) value is used so that the measured voltage value has a positive number.

Then, resistance values of the insulation resistance $R_P$ and $R_N$ are calculated by using the measured positive side and negative side voltage values.

Next, referring to FIG. 2, FIG. 2 is a diagram illustrating a process of measuring insulation resistance (internal insulation resistance and external insulation resistance) of a battery pack in the related art, and a battery pack 1 is provided at a left side of a circuit, a link capacitor 2 is provided at a right side of the circuit, an internal positive insulation resistor 3 and an internal negative insulation resistor 4 are connected to both ends of the battery pack 1 positioned at the left side, and the internal positive insulation resistor 3 and the internal negative insulation resistor 4 are serially connected to each other.

Further, the link capacitor 2 at the right side is connected to an external positive insulation resistor 5 and an external negative insulation resistor 6, and the external positive insulation resistor 5 and the external negative insulation resistor 6 are serially connected to each other.

It can be seen that a positive main relay 7 and a negative main relay 8 are positioned between the internal positive insulation resistor 3 and the internal negative insulation resistor 4, and between the external positive insulation resistor 5 and the external negative insulation resistor 6.

Further, a precharge resistor and a precharge relay are connected to both ends of the positive main relay 7 in parallel.

The positive main relay 7 and the negative main relay 8 are simultaneously electrically conducted (close), so that the battery pack 1 may be connected with the external positive insulation resistor 5 and the external negative insulation resistor 6 provided outside the battery pack.

In this case, a circuit connected from a terminal of each of the internal positive insulation resistor 3 and the internal negative insulation resistor 4 is connected with an insulation resistance meter circuit 9, and the insulation resistance meter circuit 8 serves to measure insulation resistance values of the internal positive insulation resistor 3, the internal negative insulation resistor 4, the external positive insulation resistor 5, and the external negative insulation resistor 6.

Accordingly, before the positive main relay 7 and the negative main relay 8 are electrically conducted, that is, in an open state, insulation resistance values of the internal positive insulation resistor 3 and the internal negative insulation resistor 4 are measured, and when the positive main relay 7 and the negative main relay 8 are electrically conducted (close), insulation resistance values of the external positive insulation resistor 5 and the external negative insulation resistor 6 are measured.

That is, in order to measure insulation resistance values of the external positive insulation resistor 5 and the external negative insulation resistor 6 by using the method in the related art, both the positive main relay 7 and the negative main relay 8 need to be electrically conducted, so that when both the positive main relay 7 and the negative main relay 8 are electrically conducted in the state where the external positive insulation resistor 5 and the external negative insulation resistor 6 are broken, a risk of electric shock may be generated due to the generation of a leakage current.

Accordingly, an apparatus 100 for measuring insulation resistance of a battery pack by using a negative relay, which is capable of measuring an insulation resistance value of a battery pack by using only a negative relay, of the present invention will be described with reference to FIG. 3.

FIG. 3 a diagram schematically illustrating a process of measuring insulation resistance (internal insulation resistance and external insulation resistance) of a battery pack through an apparatus 100 for measuring insulation resistance of a battery pack by using a negative relay according to an exemplary embodiment of the present invention.

Referring to FIG. 3, the apparatus 100 for measuring insulation resistance of a battery pack by using a negative relay according to the present invention may be connected with an internal positive insulation resistor 3 and an internal negative insulation resistor 4 connected to both ends of a battery pack 1, and a negative main relay 8 connected with the internal positive insulation resistor 5 and the internal negative insulation resistor 6.

In the meantime, it is noted that a circuit configuration adopting the apparatus 100 for measuring insulation resistance of a battery pack by using a negative relay according to the present invention may correspond to the circuit configuration of measuring insulation resistance of a battery pack in the related art illustrated in FIG. 2.

A measurement unit 110 connected with the internal positive insulation resistor 3 and the internal negative insulation resistor 4 measures resistance values of the internal positive insulation resistor 3 and the internal negative insulation resistor 4 in an initial state (the state where a positive main relay 7 and the negative main relay 8 are not electrically conducted) in advance, and a calculating unit 120 calculates a resistance value of each of an external positive insulation resistor 5 and an external negative insulation resistor 6 in the state where the negative main relay 8 is electrically conducted.

Further, when the resistance values of the internal positive insulation resistor 3 and the internal negative insulation resistor 4 are measured through the measurement unit 110 in the state where the negative main relay 8 is electrically conducted, parallel resistance values of the external positive insulation resistor 5 and the external negative insulation resistor 6 are also measured.

In the meantime, since the link capacitor 2 positioned at the output terminal in the state where the negative main relay 8 is electrically conducted is in a completely discharged state, and has large capacitance, a potential difference between both ends of the link capacitor 2 maintains 0.

Further, the resistance value of the internal negative insulation resistor 4 has been already measured before the negative main relay 8 is electrically conducted, so that it is possible to calculate a resistance value of each of the external positive insulation resistor 5 and the external negative insulation resistor 6 based on the previously measured resistance value of the internal negative insulation resistor 4 and the parallel resistance value of the external positive insulation resistor 5 and the external negative insulation resistor 6, which is possible because the external positive insulation resistor 5 and the external negative insulation resistor 6 are connected to the internal negative insulation resistor 4 in parallel.

The process of measuring insulation resistance of the battery pack described with reference to FIG. 3 will be sequentially described with reference to FIG. 4.

FIG. 4 is a flowchart sequentially illustrating a process of measuring insulation resistance of a battery pack through the apparatus 100 for measuring insulation resistance of a battery pack by using a negative relay according to the exemplary embodiment of the present invention.

Referring to FIG. 4, first, in an initial state in which the negative main relay is not electrically conducted, the measuring unit measures resistance values of the internal positive insulation resistor and the internal negative insulation resistor (S401).

Next, after the negative main relay is electrically conducted (S402), when the resistance values of the internal positive insulation resistor and the internal negative insulation resistor are measured by the measuring unit in the state where the negative main relay is electrically conducted, a parallel resistance value of the external positive insulation resistor and the external negative insulation resistor, which are connected to the internal negative insulation resistor in parallel, is measured together (S403).

Next, the calculating unit calculates a resistance value of each of the external positive insulation resistor and the external negative insulation resistor, which are connected to the internal negative insulation resistor in parallel, based on the resistance value of the internal negative insulation resistor measured before the negative main relay is electrically conducted and the parallel resistance value measured after the negative main relay is electrically conducted (S404).

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. An apparatus for measuring insulation resistance of a battery pack using a negative main relay, the apparatus comprising:
    a measuring unit configured to measure resistance values of an internal positive insulation resistor and an internal negative insulation resistor, the measuring unit being connected to both ends of the battery pack; and
    a calculating unit configured to calculate, when the negative main relay is electrically conducted, resistance values of an external positive insulation resistor and an external negative insulation resistor, based on:
        the resistance values of the internal positive insulation resistor and the internal negative insulation resistor measured by the measuring unit in an open state before the negative main relay is electrically conducted, and
        a parallel resistance value of the external positive insulation resistor and the external negative insulation resistor measured by the measurement unit after the negative main relay is electrically conducted,
    wherein the external positive insulation resistor and the external negative insulation resistor are connected in parallel with the internal negative insulation resistor after the negative main relay is electrically conducted,
    wherein the negative main relay is connected at one side with the external positive insulation resistor and is connected at another side with the measuring unit,
    wherein a link capacitor is connected to the external positive insulation resistor and to the external negative insulation resistor, and
    wherein the insulation resistance of the battery pack is measured only when the negative main relay is electrically conducted, and not when a positive main relay is electrically conducted.

2. The apparatus of claim 1, wherein when the resistance values of the internal positive insulation resistor and the internal negative insulation resistor are further measured by the measuring unit when the negative main relay is electrically conducted, and
    wherein the parallel resistance value of the external positive insulation resistor and the external negative insulation resistor is measured together.

3. A method of measuring insulation resistance of a battery pack using a negative main relay, the method comprising:
    measuring, by a measuring unit connected to an internal positive insulation resistor and an internal negative insulation resistor and connected to both ends of a battery pack, resistance values of the internal positive insulation resistor and the internal negative insulation resistor in an open state before the negative main relay is electrically conducted;
    electrically conducting a negative main relay, wherein the negative main relay is connected at one side with an external positive insulation resistor and is connected at another side with the measuring unit, and wherein a link capacitor is connected to the external positive insulation resistor and to an external negative insulation resistor; and
    calculating, by a calculating unit, resistance values of the external positive insulation resistor and the external negative insulation resistor, based on:
        the resistance values of the internal positive insulation resistor and the internal negative insulation resistor measured by the measuring unit in the open state before the negative main relay is electrically conducted, and
        a parallel resistance value of the external positive insulation resistor and the external negative insulation resistor measured by the measurement unit after the negative main relay is electrically conducted,
    wherein the external positive insulation resistor and the external negative insulation resistor are connected in parallel with the internal negative insulation resistor after the negative main relay is electrically conducted, and
    wherein the insulation resistance of the battery pack is measured only when the negative main relay is electrically conducted, and not when a positive main relay is electrically conducted.

4. The method of claim 3,
    wherein the electrically conducting the negative main relay includes measuring the parallel resistance value of the external positive insulation resistor and the external negative insulation resistor when the negative main relay is electrically conducted.

5. The method of claim 4, wherein the measuring of the resistance values of the external positive insulation resistor and the external negative insulation resistor when the negative main relay is electrically conducted includes measuring the parallel resistance value of the external positive insulation resistor and the external negative insulation resistor together when the resistance values of the internal positive insulation resistor and the internal negative insulation resistor are measured by the measuring unit.

* * * * *